(12) United States Patent
Liu et al.

(10) Patent No.: US 11,140,771 B2
(45) Date of Patent: Oct. 5, 2021

(54) ELECTRONIC DEVICE, AND METHOD AND SYSTEM FOR COMPENSATING STRESS-SENSITIVE PARAMETER

(71) Applicant: XI'AN ZHONGXING NEW SOFTWARE CO., LTD., Xi'an (CN)

(72) Inventors: Fengpeng Liu, Guangdong (CN); Dongmei Liu, Guangdong (CN)

(73) Assignee: XI'AN ZHONGXING NEW SOFTWARE CO., LTD., Xi'an (CN)

( * ) Notice: Subject to any disclaimer, the term of this patent is extended or adjusted under 35 U.S.C. 154(b) by 683 days.

(21) Appl. No.: 16/068,508

(22) PCT Filed: Mar. 14, 2016

(86) PCT No.: PCT/CN2016/076285
§ 371 (c)(1),
(2) Date: Jul. 6, 2018

(87) PCT Pub. No.: WO2016/197645
PCT Pub. Date: Dec. 15, 2016

(65) Prior Publication Data
US 2019/0014658 A1 Jan. 10, 2019

(30) Foreign Application Priority Data

Jan. 8, 2016 (CN) .......................... 201610015662.5

(51) Int. Cl.
*H05K 1/02* (2006.01)
*G05B 15/02* (2006.01)
(Continued)

(52) U.S. Cl.
CPC ............. *H05K 1/0271* (2013.01); *G01B 7/16* (2013.01); *G01B 7/20* (2013.01); *G05B 15/02* (2013.01);
(Continued)

(58) Field of Classification Search
CPC .. H05K 1/0271; H05K 1/44; H05K 2201/042; H05K 2201/2201; H05K 2201/09136; G01B 7/17; G05B 15/02
See application file for complete search history.

(56) References Cited

U.S. PATENT DOCUMENTS 5,907,474 A * 5/1999 Dolbear ................. H01L 23/04
361/705
2008/0157850 A1 7/2008 Ausserlechner et al.
(Continued)

FOREIGN PATENT DOCUMENTS

CN 201509363 U 6/2010
CN 103125021 A 5/2013
(Continued)

OTHER PUBLICATIONS

International Search Report dated Sep. 28, 2016 for International Application No. PCT/CN2016/076285, 6 pages.
(Continued)

*Primary Examiner* — Ronald D Hartman, Jr.
(74) *Attorney, Agent, or Firm* — Knobbe Martens Olson & Bear LLP

(57) ABSTRACT

Provided is a method for compensating a stress-sensitive parameter, and the method is applied to an electronic devices. The method includes: calculating (51) a deformation value of a first panel according to a pressure borne by the first panel; calculating (52) according to the deformation value of the first panel a deformation value of a second panel that is deformed due to the deformation of the first panel; calculating (53) according to the deformation value of the second panel a change in a stress-sensitive parameter of a stress-sensitive element on the second panel; and compensating (54) the stress-sensitive parameter according to the change in the stress-sensitive parameter. The quality of the parameters of corresponding electronic elements and elec-
(Continued)

tronic modules are thereby improved, ultimately enhancing the performance of electronic device.

20 Claims, 5 Drawing Sheets

(51) Int. Cl.
*H05K 1/14* (2006.01)
*G01B 7/16* (2006.01)
*G06F 30/398* (2020.01)

(52) U.S. Cl.
CPC .......... *G06F 30/398* (2020.01); *H05K 1/144* (2013.01); *H05K 2201/042* (2013.01); *H05K 2201/09136* (2013.01); *H05K 2201/10083* (2013.01); *H05K 2201/10151* (2013.01)

(56) References Cited

U.S. PATENT DOCUMENTS

| | | | | |
|---|---|---|---|---|
| 2008/0285242 | A1* | 11/2008 | Charny | H05K 1/0271 361/749 |
| 2010/0012358 | A1* | 1/2010 | Tatsuzawa | H01R 4/04 174/257 |
| 2011/0130860 | A1 | 6/2011 | Kelley | |
| 2012/0300426 | A1* | 11/2012 | Yamamoto | H05K 1/118 361/803 |
| 2014/0217608 | A1* | 8/2014 | Takayama | H01L 23/4006 257/774 |
| 2015/0016069 | A1 | 1/2015 | Fu et al. | |
| 2016/0316554 | A1* | 10/2016 | Kishi | H05K 3/323 |

FOREIGN PATENT DOCUMENTS

| | | |
|---|---|---|
| CN | 103338586 A | 10/2013 |
| CN | 203368906 U | 12/2013 |
| CN | 203672315 U | 6/2014 |
| WO | 2008001077 A1 | 1/2008 |
| WO | WO-2008001077 A1 * | 1/2008 ........... H05K 3/4638 |

OTHER PUBLICATIONS

Written Opinion of the International Searching Authority dated Sep. 28, 2016 for International Application No. PCT/CN2016/076285, 3 pages.
Office Action for CN201610015662.5 dated Nov. 6, 2020.
Extended European Search Report for corresponding EP Application No. 16806543.1 dated Sep. 16, 2019.
Tatar, et al., On-Chip Characterization of Stress Effects on Gyroscope Zero Rate Output and Scale Factor, IEEE International Conference on Micro Electro Mechanical Systems (MSM) IEEE, Jan. 18, 2015, pp. 813-816.

* cited by examiner

ELECTRONIC DEVICE, AND METHOD AND SYSTEM FOR COMPENSATING STRESS-SENSITIVE PARAMETER

CROSS REFERENCE TO RELATED APPLICATIONS

This application is the U.S. National Phase Application under 35 U.S.C. § 371 of International Application No. PCT/CN2016/076285, filed Mar. 14, 2016, designating the U.S. and published as WO 2016/197645 A1 on Dec. 15, 2016 which claims priority to Chinese Application No. 201610015662.5, filed on Jan. 8, 2016, the entire disclosure of each of which is hereby incorporated by reference.

TECHNICAL FIELD

The present disclosure relates to, but is not limited to, an electronic device, and a method and system for compensating a parameter, and in particular to an electronic device, and a method and system for compensating a stress-sensitive parameter.

BACKGROUND

Some electronic elements and electronic element modules are relatively sensitive to stress caused by a deformation of a printed circuit board (PCB) due to external factors (pressure, temperature, humidity, and the like), so that the stress affects some important parameters of the electronic elements or electronic element module. Therefore, in the design of the overall electronic device, it is necessary to fully consider the influence of stress on the electronic elements and the electronic element modules. In the related technical solutions, passive coping techniques are mainly used, namely, electronic elements and electronic element modules which are sensitive to stress are set far away from areas with strong stress on the PCB panel, but the adverse effects caused by stress can not be completely avoided. It leads to the deterioration of some stress-sensitive parameters of the electronic elements and the electronic element modules. The deterioration affects the operation of the electronic elements and the electronic element modules, thereby reducing the performance of the electronic device.

SUMMARY

The followings are overview of the topics detailed in this article. This summary is not intended to limit the scope of the claims.

Embodiments of the present invention provide an electronic device, and a method and system for compensating a stress-sensitive parameter to solve the problem that the stress-sensitive parameters of some electronic elements are deteriorated due to the passive response to stress in related arts, which affects the performance of electronic device.

According to an aspect of embodiments of the present invention, a method for compensating a stress-sensitive parameter is provided. The method is applied to an electronic device. The method includes the following steps: calculating a deformation value of a first panel according to a pressure borne by the first panel; calculating a deformation value of a second panel that is deformed due to the deformation of the first panel according to the deformation value of the first panel; calculating a change in the stress-sensitive parameter of a stress-sensitive element located on the second panel according to the deformation value of the second panel; and compensating the stress-sensitive parameter according to the change in the stress-sensitive parameter.

According to an aspect of embodiments of the present invention, an electronic device is provided. The electronic device includes a memory and a processor, the memory stores program instructions, and the processor processes the program instructions to perform the following steps: calculating a deformation value of a first panel according to a pressure borne by the first panel; calculating a deformation value of a second panel that is deformed due to the deformation of the first panel according to the deformation value of the first panel; calculating a change in the stress-sensitive parameter of a stress-sensitive element located on the second panel according to the deformation value of the second panel; and compensating the stress-sensitive parameter according to the change in the stress-sensitive parameter.

According to an aspect of embodiments of the present invention, a system for compensating a stress-sensitive parameter is provided. The system operates on an electronic device. The system includes: a first calculation module, configured to calculate a deformation value of a first panel according to a pressure borne by the first panel; a second calculation module, configured to calculate a deformation value of a second panel that is deformed due to the deformation of the first panel according to the deformation value of the first panel; a third calculation module, configured to calculate a change in a stress-sensitive parameter of the stress-sensitive element located on the second panel according to the deformation value of the second panel; and a compensation module, configured to compensate the stress-sensitive parameter according to the change in stress-sensitive parameter.

According to embodiments of the present invention, the degree of deformation of the pressed panel is calculated based on acquired pressure data, and then the deformation of another panel due to the deformation of the pressed panel is calculated. A change in the stress-sensitive parameter of the pressure sensitive element on the another panel is calculated, and then the stress-sensitive parameter is compensated. The quality of the parameters of the corresponding electronic elements and electronic modules is improved, and finally the performance of electronic device is improved Other aspects can be understood after reading and understanding the drawings and detailed description.

DETAILED DESCRIPTION

The following clearly describes the technical solutions in the embodiments of the present invention with reference to the drawings in the embodiments of the present invention. The described embodiments are merely some but not all of the embodiments of the present invention. Based on the embodiments of the present invention, other embodiments obtained by those skilled in the art without paying creative work shall fall within the protection scope of the present invention.

Figure 1:
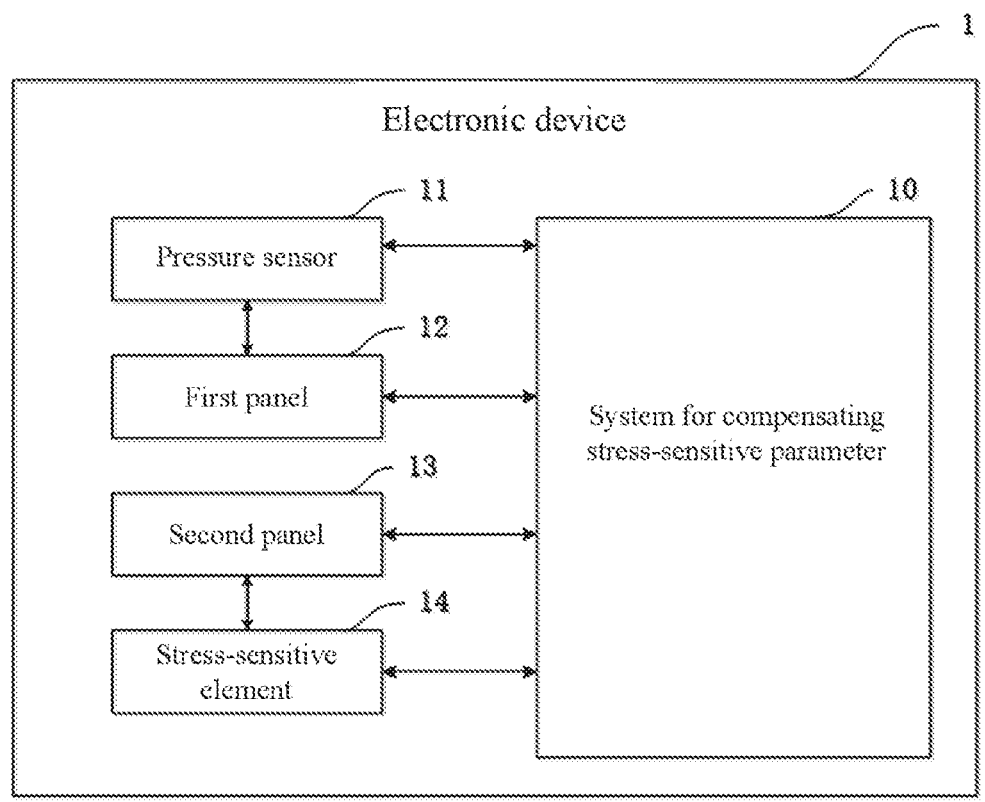
FIG. 1 is a diagram of a hardware environment architecture of an electronic device according to an embodiment of the present invention.
Figure 2:
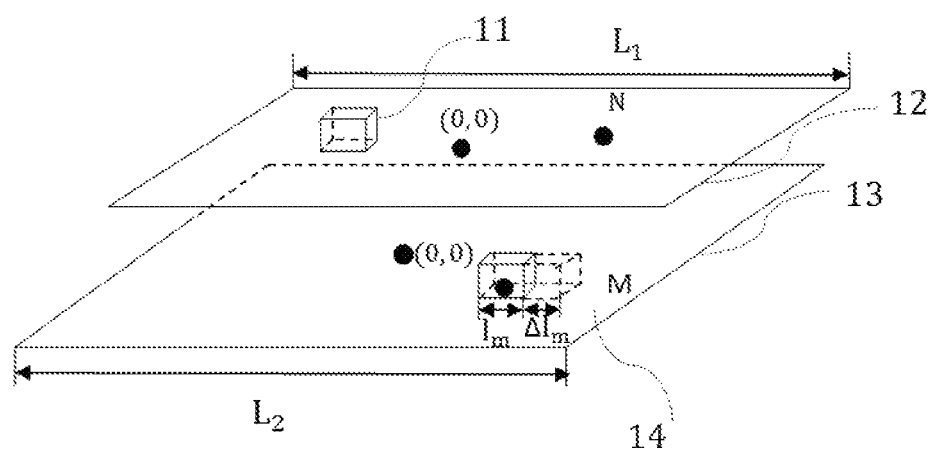
FIG. 2 is diagram illustrating positions and structures of main elements in an electronic device according to an embodiment of the present invention.
Figure 4:
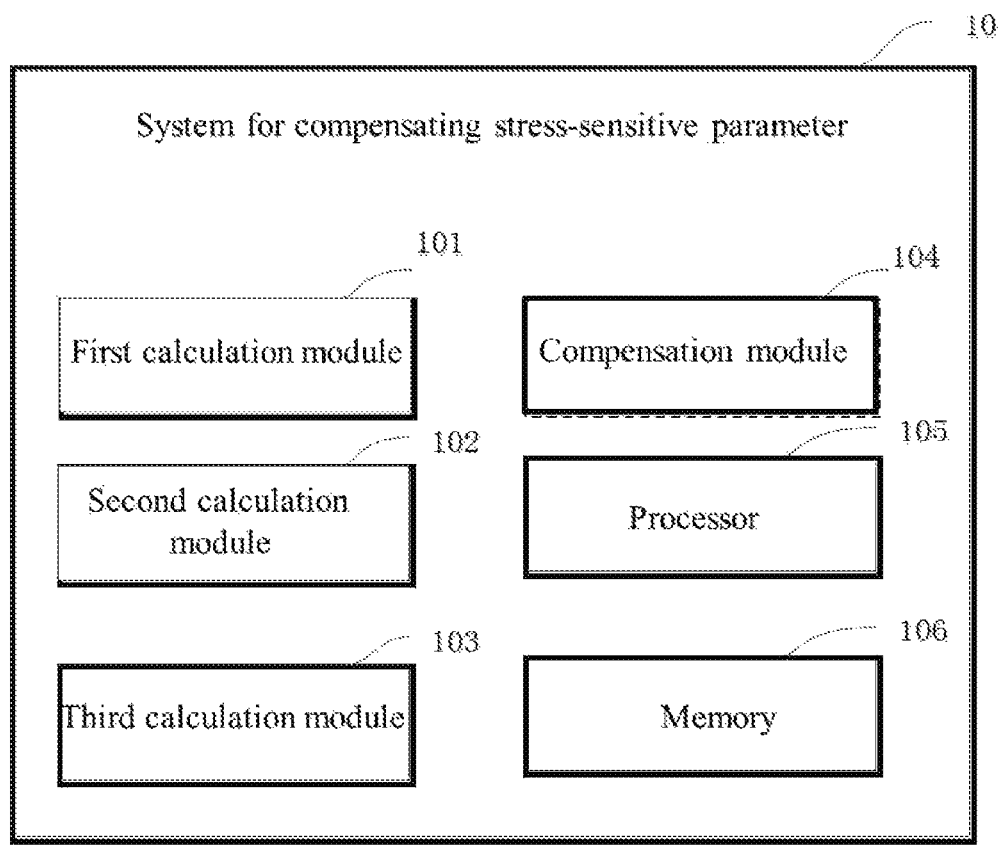
FIG. 4 is a diagram illustrating functional blocks of a system for compensating a stress-sensitive parameter according to an embodiment of the present invention.

FIG. 1 is a diagram of a hardware environment architecture in a preferred embodiment of an electronic device according to an embodiment of the present invention. The electronic device 1 includes a system for compensating stress-sensitive parameter 10, a pressure sensor 11, a first panel 12, a second panel 13, and a stress-sensitive element 14. The electronic device 1 may be, but not limited to, a mobile phone, a tablet computer, a video camera, and the like. The second panel 13 may be a printed circuit board (PCB), (hereinafter PCB panel for short). As shown in FIG. 2, the pressure sensor 11 is located on the first panel 12, the stress-sensitive element 14 is located on the second panel 13, and the distance between the first panel 12 and the second panel 13 is configured such that when a pressure is applied on the first panel 12, the second panel 13 is deformed due to the deformation of the first panel 12. The pressure sensor 11 detects the pressure received by the first panel 12 and obtains the pressure data of the pressure, and sends the pressure data to the stress-sensitive parameter compensating system 10. The system for compensating stress-sensitive parameter 10 calculates the deformation value of the first panel 12 according to the pressure data, calculates the deformation value of the second panel 13 according to the deformation value of the first panel 12, calculates the change in the stress-sensitive parameter of the stress-sensitive element 14 according to the deformation value of the second panel 13, and compensates the stress-sensitive parameter according to the change in abnormal sensitive parameter. The above specific calculation and compensation method is illustrated in FIG. 4. The stress-sensitive parameters refer to some parameters of the electronic elements or the electronic element modules which are sensitive to stress caused by the deformation of the panel where the electronic elements or the electronic element modules are located, such as the operating frequency, the operating capacitance, the breakdown voltage and other parameters of the electronic elements.

FIG. 4 is a diagram illustrating functional blocks of the system for compensating stress-sensitive parameter according to an embodiment of the present invention. The system for compensating stress-sensitive 10 includes one or more modules. In this embodiment, the one or more modules include a first calculation module 101, a second calculation module 102, a third calculation module 103, and a compensation module 104. The system for compensating stress-sensitive 10 further includes a processor 105 and a memory 106.

The term "module" in the embodiments of the present invention refers to a series of computer program instructions executed by a processor of an electronic device having a function of compensating stress-sensitive parameter, and the computer program instructions are capable of performing a certain technical function. The computer program instructions are stored in the memory 105. The processor 106 executes the computer program instructions. The processor 105 is a Read-Only Memory (ROM) or a Random Access Memory (RAM).

The first calculation module 101 is configured to calculate the deformation value of the first panel 12 according to the pressure borne by the first panel 12. The pressure borne by the first panel 12 is detected by the pressure sensor 11. As shown in FIG. 2, when the pressure sensor 11 detects that a pressure is applied to a position on the first panel 12, the pressure sensor 11 determines the coordinate value $(x_1, y_1)$ of the position bearing the pressure and the pressure value $p_1$ by taking the geometric center of the first panel 12 as a coordinate origin. The pressure sensor 11 detects and collects the pressure values of all the coordinate points on the first panel 12, and gets a group of pressure data recorded as: $p_1, p_2, p_3 \ldots p_n$.

Figure 3:
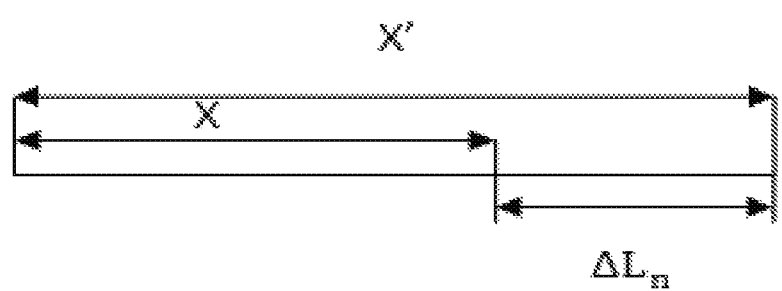
FIG. 3 is a schematic diagram of a coordinate change of an point N caused by a deformation of a first panel according to an embodiment of the present invention.

The deformation value of the first panel 12 and the pressure value of the pressure borne by the first panel 12 have the following correlation coefficient λn, which is related to the coordinate (x, y). Assuming that the point N (x, y) on the first panel 12 bears a pressure and is deformed, the coordinate of the point N becomes (x', y'). It is assumed that $L_1$ is the original length of the first panel 12 before deformation, and $\Delta L_n$ is an increased or decreased amount of value x of the point N caused by the deformation generated by the stress, that is, $\Delta L_n = |x'-x|$, as shown in FIG. 3. The first deformation coefficient generated at the point N is $\lambda_n = \Delta L_n / L_1$. $\Delta L_n$ depends on the material of the first panel 12, and the first deformation coefficient depends on $\Delta L_n$. The deformation value of the first panel 12 is $d_n = \lambda_n \times p_n$. Similarly, the deformation values of all the coordinate points on the first panel 12 can be calculated, and a group of deformation data are obtained and recorded as: $d_1, d_2 \ldots d_n$.

The second calculation module 102 is configured to calculate the deformation value of the second panel 13 that is deformed due to the deformation of the first panel 12 according to the deformation value of the first panel 12. A linear relationship is existed between the deformation value of the second panel 13 and the deformation value of the first panel 12. The deformation of the first panel 12 causes the deformation of the second panel 13. As shown in FIG. 2, it is assumed that the point M $(x_1, y_1)$ of the second panel 13 is deformed, and the coordinate of the point M becomes $(x_1', y_1')$. The point M is a position in a coordinate system with the geometric center point of the second panel 13 as the origin, and the point M corresponds to the coordinate point of $d_n$ (defining that n>m) in the group of deformation values $d_1, d_2 \ldots d_n$ of the first panel. It is assumed that $L_2$ is the original length of the second panel 13 before being deformed, and $\Delta L_m$ is an increased or decreased amount of value $x_1$ of the point M caused by the stress generated due to the deformation, that is, $\Delta L_m = |x_1'-x_1|$. The second deformation coefficient generated at the M point is $\lambda_m = \Delta L_m / L_2$. $\Delta L_m$ depends on the material of the second panel 13, and the second deformation coefficient $\lambda_m$ depends on the $\Delta L_m$. The deformation value of the second panel 13 is $d_m' = \lambda_m \times d_m$. Similarly, the deformation values of all the coordinate points on the second panel 13 can be calculated, and a group of deformation data are obtained and recorded as: $d_1', d_2' \ldots d_m'$.

The third calculation module 103 is configured to calculate the change of the stress-sensitive parameter of the stress-sensitive element 14 located on the second panel 13 according to the deformation value of the second panel 13. The deformation of the second panel 13 caused by the stress may affect the stress-sensitive parameter of the stress-sensitive electronic element 14 and cause the stress-sensitive parameter to change. As shown in FIG. 2, still referring to the point M described above, the coordinate $(x_1, y_1)$ denotes the position of the stress-sensitive element 14 in the coordinate system with the geometric center point of the second panel 13 as the origin. $l_m$ is the length of the stress-sensitive element, and $l_m'$ is the length of the stress-sensitive element under the stress caused by the deformation of the second panel 13. $\Delta l_m$ is the change in the length of the stress-sensitive element, that is, an increased or decreased amount of the length l of the stress-sensitive element caused by the stress generated due to the deformation of the second panel 13, that is, $\Delta l_m = |l_m - l_m'|$. $\Delta h$ is the change of the stress-sensitive parameter per unit length of the stress-sensitive element, and the third deformation coefficient generated at this point is $\lambda_h = \Delta_h/\Delta l_m$. $\Delta l_m$, $\Delta h$ and $\lambda.h$ depend on the stress-sensitive element 14, and the change of the stress-sensitive parameter of the stress-sensitive element 14 is $\Delta H = \lambda_h \times d_m'$.

Figure 6:
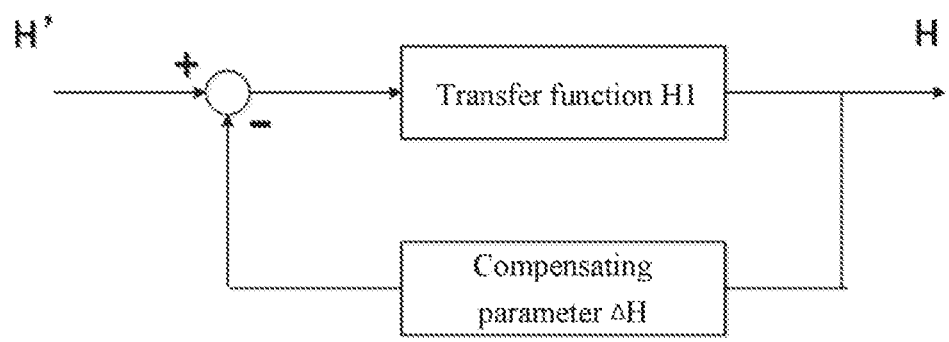
FIG. 6 is a diagram illustrating a closed-loop feedback in compensating a change in the stress-sensitive parameter according to an embodiment of the present invention.

The compensation module 104 is configured to compensate the stress-sensitive parameter according to the change of the stress-sensitive parameter. The stress-sensitive parameter of the stress-sensitive element 14 is defined as H, and the stress-sensitive parameter H of the stress-sensitive element 14 becomes H' due to the stress and deformation, and the compensation value is the change of the stress-sensitive parameter which is recorded as $\Delta H$. In one embodiment, the compensation for the change of the stress-sensitive parameter adopts a negative feedback compensation manner. As shown in FIG. 6, the negative feedback compensation is performed on H', and the transfer function is $H_1$, and the compensation formula is: $H = H' \times H_1/[1 + H_1 \times \Delta H]$.

In another embodiment, the stress-sensitive element 14 is a crystal oscillator, which is a kind of resonant element made by utilizing the piezoelectric effect of a quartz crystal. An electric field with a specific frequency is applied between two electrodes of the stress-sensitive element 14, causing a mechanical deformation of the stress-sensitive element 14 and generating a resonance phenomenon, so the frequency parameter of the crystal oscillator is very sensitive to stress. The original operating frequency of the crystal oscillator is F, that is, the original stress-sensitive parameter is F. When a stress is generated in the panel where the crystal oscillator due to a pressure applied on the panel, the stress-sensitive parameter of the crystal oscillator becomes F', that is, the working frequency becomes F. The crystal frequency transfer function is $F_1$, and $\Delta F$ is the change in the stress-sensitive parameter. For the negative feedback frequency compensation of the crystal oscillator, the compensation formula for adjusting the stress-sensitive parameter of the crystal oscillator is $F = F' \times F_1/[1 + F_1 \times \Delta F]$.

Figure 5:
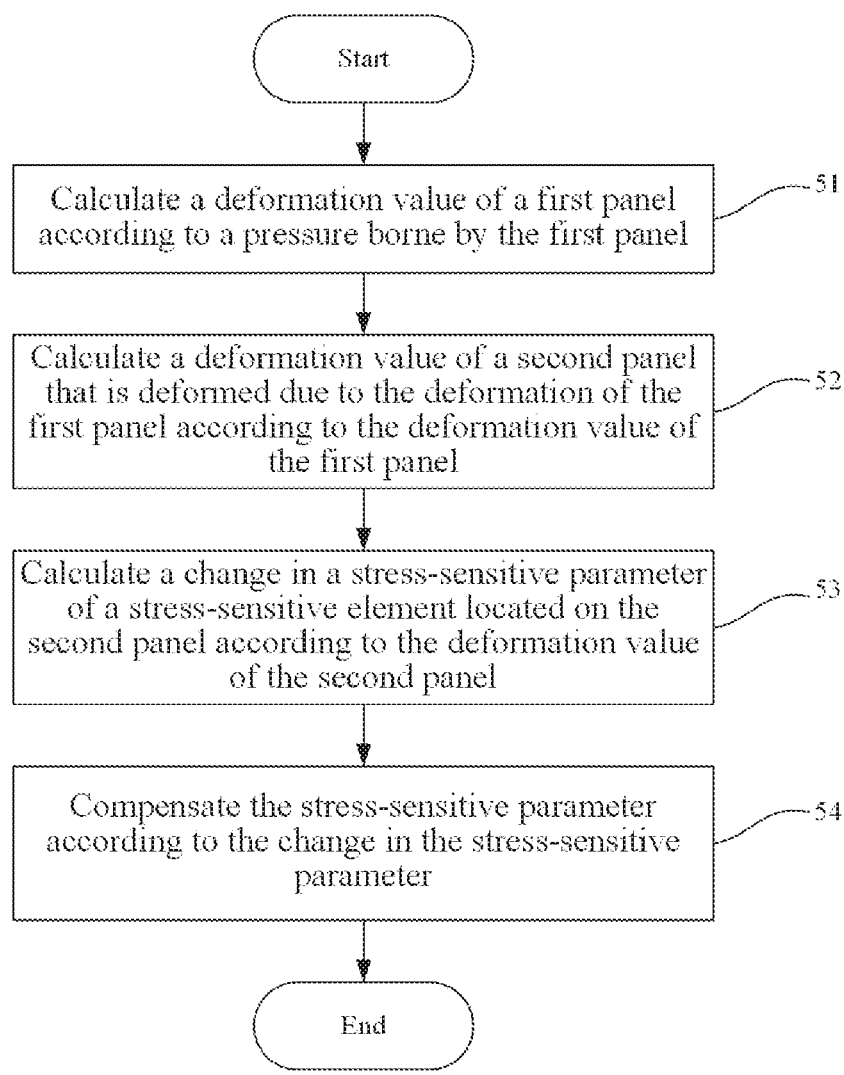
FIG. 5 is a flowchart of a method for compensating a stress-sensitive parameter according to an embodiment of the present invention.

FIG. 5 is a flowchart of a method for compensating a stress-sensitive parameter according to an embodiment of the present invention.

In step 51, the first calculation module 101 calculates the deformation value of the first panel 12 according to the pressure borne by the first panel 12. The pressure borne by the first panel 12 is detected by the pressure sensor 11. As shown in FIG. 2, when the pressure sensor 11 detects that a position on the first panel 12 is under pressure, the pressure sensor 11 determines the coordinate value $(x_1, y_1)$ of the pressure position bearing the pressure and the pressure value $p_1$ of the pressure by taking the geometric center of the first panel 12 as the coordinate origin. The pressure sensor 11 detects and collects the pressure values of all the coordinate points on the first panel 12, and gets a group of pressure data recorded as: $p_1, p_2, p_3 \ldots p_n$.

The deformation value of the first panel 12 and the pressure value of the pressure borne by the first panel 12 have the following correlation coefficient $\lambda_n$, which is related to the coordinate (x, y). Assuming that the point N (x, y) on the first panel 12 is deformed under pressure, the coordinate of the point N becomes (x', y'). It is assumed that $L_1$ is the original length of the first panel 12 before being deformed, and $\Delta L_n$ is an increased or decreased amount of value x of the point N caused by the stress generated by the deformation, that is, $\Delta L_n = |x' - x|$, as shown in FIG. 3. The first deformation coefficient generated at the point N is $\lambda_n = \Delta L_n/L_1$. $\Delta L_n$ depends on the material of the first panel 12, and the first deformation coefficient depends on $\Delta L_n$. The deformation value of the first panel 12 is $d_n = \lambda_n \times p_n$. Similarly, the deformation values of all the coordinate points on the first panel 12 can be calculated, and a group of deformation data are obtained and recorded as: $d_1, d_2 \ldots d_n$.

In step 52, the second calculation module 102 calculates the deformation value of the second panel 13 that is deformed due to the deformation of the first panel 12 according to the deformation value of the first panel 12. A linear relationship is existed between the deformation value of the second panel 13 and the deformation value of the first panel 12. The deformation of the first panel 12 causes the deformation of the second panel 13. As shown in FIG. 2, it is assumed that the point M $(x_1, y_1)$ of the second panel 13 is deformed, and the coordinate value of the point M becomes $(x_1', y_1')$. The point M is a position in a coordinate system with the geometric center point of the second panel 13 as the origin, and the point M corresponds to the coordinate point of $d_n$ (defining as n>m) in the group of deformation values $d_1, d_2 \ldots d_n$ of the first panel. It is assumed that $L_2$ is the original length of the second panel 13 before being deformed. $\Delta L_m$ is an increased or decreased amount of value $x_1$ of the point M caused by the stress generated by deformation, that is, $\Delta L_m = |x_1' - x_1|$. The second deformation coefficient generated by the M point is $\lambda_m = \Delta L_m/L_2$. $\Delta L_m$ depends on the material of the second panel 13, and the second deformation coefficient $\lambda_m$ depends on the $\Delta L_m$. The deformation value of the second panel 13 is $d_m' = \lambda_m \times d_m$. Similarly, the deformation values of all the coordinate points on the second panel 13 can be calculated, and a group of deformation data are obtained and recorded as: $d_1', d_2' \ldots d_m'$.

In step 53, the third calculating module 103 calculates the change of the stress-sensitive parameter of the stress-sensitive element 14 located on the second panel 13 according to the deformation value of the second panel 13. The deformation of the second panel 13 caused by the stress may affect the stress-sensitive parameter of the stress-sensitive electronic element 14 and cause the stress-sensitive parameter to change. As shown in FIG. 2, still referring to the point M described above, the coordinate $(x_1, y_1)$ denotes the position of the stress-sensitive element 14 in the coordinate system with the geometric center point of the second panel 13 as the origin. $l_m$ is the length of the stress-sensitive element, and $l_m'$ is the length of the stress-sensitive element under the stress caused by the deformation of the second panel 13. $\Delta l_m$ is the change in the length of the stress-sensitive element, that is, an increased or decreased amount of the length l of the stress-sensitive element caused by the stress generated by the deformation of the second panel 13, that is, $\Delta l_m = |l_m - l_m'|$. $\Delta h$ is the change of the stress-sensitive parameter per unit length of the stress-sensitive element, and the third deformation coefficient generated at this point is $\lambda_h = \Delta h/\Delta l_m$. $\Delta l_m$, $\Delta h$ and $\lambda.h$ depend on the stress-sensitive element 14, and the change of the stress-sensitive parameter of the stress-sensitive element 14 is $\Delta H = \lambda_h \times d_m'$.

In step 54, the compensation module 104 compensates the stress-sensitive parameter according to the change of the stress-sensitive parameter. The stress-sensitive parameter of the stress-sensitive element 14 is defined as H, and the stress-sensitive parameter H of the stress-sensitive element 14 becomes H' due to the stress and deformation, and the compensation value is the change of the stress-sensitive parameter which is recorded as ΔH. In one embodiment, the compensation for the change of the stress-sensitive parameter adopts the negative feedback compensation method. As shown in FIG. 6, the negative feedback compensation is performed on H', the transfer function is H1, and the compensation formula is: H=H'×H$_1$/[1+H$_1$×ΔH].

In another embodiment, the stress-sensitive element 14 is a crystal oscillator, which is a kind of resonant element made by utilizing the piezoelectric effect of a quartz crystal. An electric field with a specific frequency is added to two electrodes of the stress-sensitive element 14, causing a mechanical deformation of the stress-sensitive element 14 and generating a resonance phenomenon, so the frequency parameter of the crystal oscillator is very sensitive to stress. The original operating frequency of the crystal oscillator is F, that is, the original stress-sensitive parameter is F. When a stress is generated in the panel where the crystal oscillator due to a pressure applied on the panel, the stress-sensitive parameter of the crystal oscillator becomes F, that is, the working frequency becomes F. The crystal frequency transfer function is F$_1$, and ΔF is the change in the stress-sensitive parameter. For the negative feedback frequency compensation of the crystal oscillator, the compensation formula for adjusting the stress-sensitive parameter of the crystal oscillator is F=F'×F$_1$/[1+F$_1$×ΔF].

An embodiment of the present invention further provides a computer-readable storage medium. In an alternative embodiment, the above storage medium may be configured to store program codes executable by a processor. The steps of the program codes are as follows.

In step S1, the deformation value of the first panel 12 is calculated according to the pressure borne by the first panel 12.

In step S2, the deformation value of the second panel 13 that is deformed due to the deformation of the first panel 12 is calculated according to the deformation value of the first panel 12.

In step S3, the change in the stress-sensitive parameter of the stress-sensitive element 14 located on the second panel 13 is calculated according to the deformation value of the second panel 13.

In step S4, the stress-sensitive parameter is compensated according to the change of the stress-sensitive parameter.

Alternatively, in this embodiment, the foregoing storage medium may include but is not limited to a USB flash disk, a Read-Only Memory (ROM), a Random Access Memory (RAM), a mobile hard disk, a disk, or optical discs and medium the like that can store program codes.

Optionally, for specific examples in this embodiment, reference can be made to the examples described in the foregoing embodiments and alternative embodiments, which are not described herein again in this embodiment.

Obviously, those skilled in the art should understand that each of the modules or each of the steps of the foregoing embodiments of the present invention may be implemented by a general-purpose computing device, which may be concentrated on a single computing device or distributed on multiple computing devices. Optionally, they can be implemented with program codes executable by the computing device, so that the modules and steps can be stored in the storage device and executed by the computing device. In some cases, the steps shown or described herein are performed in a different sequence, or separately making them into single integrated circuit modules, or making a plurality of modules or steps of them in a single integrated circuit module. Thus, the present invention is not limited to any specific combination of hardware and software.

The foregoing descriptions are merely preferred embodiments of the present invention and are not intended to limit the present invention. For those skilled in the art, the present invention may have various changes and modifications. Any modification, equivalent replacement, and improvement made within the spirit and principle of the present invention shall fall within the protection scope of the present invention.

INDUSTRIAL APPLICABILITY

The technical solution improves the quality of parameters of the corresponding electronic elements and electronic modules, and improves the performance of the electronic devices.

What is claimed is:

1. A method for compensating a stress-sensitive parameter, applied to an electronic device, the method comprising:
    calculating a deformation value of a first panel according to a pressure borne by the first panel;
    calculating a deformation value of a second panel that is deformed due to a deformation of the first panel according to the deformation value of the first panel;
    calculating a change in the stress-sensitive parameter of a stress-sensitive element located on the second panel according to the deformation value of the second panel; and
    compensating a stress-sensitive parameter according to the change in the stress-sensitive parameter,
    wherein the method is performed by at least one processor.

2. The method according to claim 1, wherein the deformation value of the first panel is a product of a first deformation coefficient and the pressure borne by the first panel, and the first deformation coefficient is a ratio of a change in a length of the first panel to an original length of the first panel.

3. The method according to claim 1, wherein the deformation value of the second panel is a product of a second deformation coefficient and the deformation value of the first panel, and the second deformation coefficient is a ratio of a change in a length of the second panel to an original length of the second panel.

4. The method according to claim 1, wherein the change in the stress-sensitive parameter is a product of a third deformation coefficient and the deformation value of the second panel, and the third deformation coefficient is a ratio of a change in the stress-sensitive parameter per unit length of the stress-sensitive element to a change in a length of the stress-sensitive element.

5. The method according to claim 1, wherein compensating the stress-sensitive parameter according to the change in the stress-sensitive parameter further comprises: negative feedback compensating.

6. A non-transitory computer-readable storage medium, storing computer-executable instructions that, when executed by a processor, cause the processor to perform the method of claim 1.

7. The non-transitory computer-readable storage medium according to claim 6, wherein the deformation value of the first panel is a product of a first deformation coefficient and the pressure borne by the first panel, and the first deformation coefficient is a ratio of a change in a length of the first panel to an original length of the first panel.

8. The non-transitory computer-readable storage medium according to claim 6, wherein the deformation value of the second panel is a product of a second deformation coefficient and the deformation value of the first panel, and the second deformation coefficient is a ratio of a change in a length of the second panel to an original length of the second panel.

9. The non-transitory computer-readable storage medium according to claim 6, wherein the change in the stress-sensitive parameter is a product of a third deformation coefficient and the deformation value of the second panel, and the third deformation coefficient is a ratio of a change in the stress-sensitive parameter per unit length of the stress-sensitive element to a change in a length of the stress-sensitive element.

10. The non-transitory computer-readable storage medium according to claim 6, wherein compensating the stress-sensitive parameter according to the change in the stress-sensitive parameter further comprises: negative feedback compensating.

11. An electronic device, comprising: a memory and a processor, wherein the memory stores computer-executable program instructions, that when executed by the processor, cause the processor to perform the following method:
calculating a deformation value of a first panel according to a pressure borne by the first panel;
calculating a deformation value of a second panel that is deformed due to a deformation of the first panel according to the deformation value of the first panel;
calculating a change in a stress-sensitive parameter of a stress-sensitive element located on the second panel according to the deformation value of the second panel; and
compensating the stress-sensitive parameter according to the change in the stress-sensitive parameter.

12. The electronic device according to claim 11, wherein the deformation value of the first panel is a product of a first deformation coefficient and the pressure borne by the first panel, and the first deformation coefficient is a ratio of a change in a length of the first panel to an original length of the first panel.

13. The electronic device according to claim 11, wherein the deformation value of the second panel is a product of a second deformation coefficient and the deformation value of the first panel, and the second deformation coefficient is a ratio of a change in a length of the second panel to an original length of the second panel.

14. The electronic device according to claim 11, wherein the change in the stress-sensitive parameter is a product of a third deformation coefficient and the deformation value of the second panel, and the third deformation coefficient is a ratio of a change in the stress-sensitive parameter per unit length of the stress-sensitive element to a change in a length of the stress-sensitive element.

15. The electronic device according to claim 11, wherein compensating the stress-sensitive parameter according to the change in the stress-sensitive parameter further comprises: negative feedback compensating.

16. A system for compensating a stress-sensitive parameter, applied to an electronic device, comprising:
a first calculator configured to calculate a deformation value of a first panel according to a pressure borne by the first panel;
a second calculator configured to calculate a deformation value of a second panel that is deformed due to a deformation of the first panel according to the deformation value of the first panel;
a third calculator configured to calculate a change in a stress-sensitive parameter of a stress-sensitive element located on the second panel according to the deformation value of the second panel; and
a compensator configured to compensate the stress-sensitive parameter according to the change in stress-sensitive parameter.

17. The system according to claim 16, wherein the deformation value of the first panel is a product of a first deformation coefficient and the pressure borne by the first panel, and the first deformation coefficient is a ratio of a change in a length of the first panel to an original length of the first panel.

18. The system according to claim 16, wherein the deformation value of the second panel is a product of a second deformation coefficient and the deformation value of the first panel, and the second deformation coefficient is a ratio of a change in a length of the second panel to an original length of the second panel.

19. The system according to claim 16, wherein the change in the stress-sensitive parameter is a product of a third deformation coefficient and the deformation value of the second panel, and the third deformation coefficient is a ratio of a change in the stress-sensitive parameter per unit length of the stress-sensitive element to a change in a length of the stress-sensitive element.

20. The system according to claim 16, wherein compensating the stress-sensitive parameter according to the change in the stress-sensitive parameter further comprises: negative feedback compensating.

* * * * *